(12) United States Patent
Buescher

(10) Patent No.: US 6,967,387 B2
(45) Date of Patent: Nov. 22, 2005

(54) INTEGRATION CAPACITOR USING A PHOTODETECTOR AS THE BOTTOM PLATE OF THE CAPACITOR

(75) Inventor: Kevin Scott Buescher, Colorado Springs, CO (US)

(73) Assignee: EM Microelectronic - Marin SA, Marin (CH)

(*) Notice: Subject to any disclaimer, the term of this patent is extended or adjusted under 35 U.S.C. 154(b) by 434 days.

(21) Appl. No.: 10/353,060

(22) Filed: Jan. 29, 2003

(65) Prior Publication Data

US 2005/0087674 A1    Apr. 28, 2005

(51) Int. Cl.[7] .......................... H01L 31/06; H01L 31/00
(52) U.S. Cl. ...................... 257/461; 257/459; 257/465
(58) Field of Search ................ 257/448, 459, 257/461, 465; 250/206, 214 A, 214 C

(56) References Cited

U.S. PATENT DOCUMENTS

| | | | |
|---|---|---|---|
| 5,233,180 A | | 8/1993 | Tsuruta et al. |
| 6,150,649 A | * | 11/2000 | Wake et al. ............ 250/208.1 |
| 2005/0045910 A1 | * | 3/2005 | Taylor et al. ............... 257/184 |

FOREIGN PATENT DOCUMENTS

| WO | WO 00/55919 A1 | 9/2000 |
|---|---|---|
| WO | WO 02/47255 A1 | 6/2002 |

OTHER PUBLICATIONS

Matherson K. J. et al: Progress in the Development Large-Area Modular 64/spl times/64 CdZnTe imaging arrays for nuclear medicine: Nuclear Science Symposium, 1997. IEEE Albuquerque, NM US Nov. 9-15, 1997, New York, NY, USA, IEEE, US Nov. 9, 1997, pp. 276-280, XP010275807 ISBN: 0-7803-4258-5, p. 278; figure 4.

* cited by examiner

Primary Examiner—Ngân V. Ngô
(74) Attorney, Agent, or Firm—Sughrue Mion, PLLC

(57) ABSTRACT

There is described an integrating circuit for converting light energy produced by a photodetector into a voltage signal, this integrating circuit comprising an amplifier having an input coupled to a terminal of the photodetector and an output for outputting the voltage signal, and an integration capacitor having a first electrode connected to the amplifier input and a second electrode connected to the amplifier output. The first electrode of the capacitor is formed by the terminal of the photodetector connected to the amplifier input and the second electrode is formed by a layer of conductive material deposited on top of the photodetector and separated from this photodetector by a layer of insulating material, these layers of conductive material and of insulating material being transparent or nearly transparent at least for a given range of wavelengths of light. There is also described a method of forming the integration capacitor as well as a photodetector including the integration capacitor.

13 Claims, 3 Drawing Sheets

INTEGRATION CAPACITOR USING A PHOTODETECTOR AS THE BOTTOM PLATE OF THE CAPACITOR

FIELD OF THE INVENTION

The present invention generally relates to integrating circuits (or integrators) for converting light energy produced by a photodetector into a voltage signal, such integrating circuits typically comprising an amplifier having an input coupled to a terminal of the photodetector and an output for outputting the voltage signal and an integration capacitor having a first electrode connected to the amplifier input and a second electrode connected to the amplifier output.

BACKGROUND OF THE INVENTION

Integrating circuits are well-known in the art and are used in various types of applications where conversion of light energy into electrical signals is required. Such applications for instance include image sensing in digital cameras or other imaging systems, motion sensing in optical pointing or scanning devices, signal detection in optical pickup devices such as CD-ROM or DVD-ROM drives, etc.

FIG. 1 schematically shows the known configuration of an integrating circuit where reference numeral 10 designates the photodetector PD which, when subjected to illumination, produces a current (or photo-generated current) $I_{PD}$ which is proportional to light intensity on photodetector 10. This current $I_{PD}$ is converted to a voltage signal $V_{OUT}$ by means of an amplifier circuit 30 and a capacitor 20 (commonly referred to as "integration capacitor") of capacitance value $C_{INT}$ which is connected between an input 31 and an output 32 of amplifier 30. Amplifier 30 may include another input (not represented) connected to a reference potential such as ground.

FIG. 2 schematically shows a known configuration of photodetector 10 which consists of a photodiode comprising a well 11 of a first conductivity type (in this illustration an n-type well) diffused in a semiconductor substrate (or well) 12 of a second conductivity type (here a p-type semiconductor substrate). The well 11 forms the photosensitive region of the photodetector 10 and is coupled to the amplifier's input 31 as shown in FIG. 1 (typically through an n+ diffusion region in n-well 11 which is not represented in FIG. 2).

Integration capacitor 20 is typically formed as a distinct component requiring additional surface area on the chip. This integration capacitor 20 can typically be built as a stack of two layers of polysilicon or of metal and polysilicon layer with an intermediate insulating layer or as a capacitor-connected MOS device (for instance a MOS transistor having source and drain terminals connected together). All these solutions require area to implement.

In the above-mentioned applications, the optical sensing device typically comprises an array of a plurality of photodetector-integrator pairs. Layout space is usually at a premium and both the photodetector and the integration capacitor can take a lot of area. Tradeoffs must be made between the sizes of them. Typically the photodetector and integration capacitor are large and thus form a difficult constraint to any optimisation plan. One aim of the present invention is thus to find a solution to this problem, i.e. provide a solution which helps optimising the surface area of light conversion integrating circuits.

SUMMARY OF THE INVENTION

To this end, the invention has as a first object an integration circuit for converting light energy produced by a photodetector into a voltage signal, this integrating circuit comprising:

an amplifier having an input coupled to a terminal of the photodetector and an output for outputting the voltage signal; and an integration capacitor having a first electrode connected to the amplifier input and a second electrode connected to the amplifier output, wherein the first electrode of the capacitor is formed by the terminal of the photodetector connected to the amplifier input and wherein the second electrode is formed by a layer of conductive material deposited on top of the photodetector and separated from this photodetector by a layer of insulating material, the layers of conductive material and of insulating material being transparent or nearly transparent at least for a given range of wavelengths of light.

A second object of the invention is a method of forming an integration capacitor for an integrating circuit which converts light energy of a photodetector into a voltage signal, the integrating circuit comprising an amplifier having an input coupled to a terminal of the photodetector and an output for outputting the voltage signal, the method comprising the steps of:

depositing a layer of insulating material on top of at least a portion of the photodetector;

depositing a layer of conductive material on top of the photodetector and the layer of insulating material; and connecting the layer of conductive material to the amplifier output, the layers of conductive material and of insulating material being transparent or nearly transparent at least for a given range of wavelengths of light.

A third object of the invention is a photodetector for connection to a conversion circuit including an integration capacitor for converting a photo-current produced by the photodetector into a voltage signal, wherein the photodetector includes a layer of conductive material deposited on top of a photosensitive region of the photodetector and separated from this photosensitive region by a layer of insulating material, wherein the layer of conductive material acts as a first electrode of the integration capacitor while the photosensitive region of the photodetector acts as a second electrode of the integration capacitor, and wherein the layers of conductive material and of insulating material are transparent or nearly transparent at least for a given range of wavelengths of light.

Various advantageous embodiments of the invention are the subject of the dependent claims. In particular, the layer of conductive material may advantageously be a non-salicided polysilicon layer while the layer of insulating material may simply be an oxide.

The photodetector is advantageously a photodiode comprising a well of a first conductivity type diffused in a semiconductor substrate or well of a second conductivity type (for instance an n-well diffused in a p-type substrate or well, or a p-well diffused in an n-type substrate or well). Other types of photodetectors such as phototransistors are also possible.

As regards the second electrode of the integration capacitor, this electrode can be formed as a single and continuous patch of conductive material (for instance a substantially square-shaped patch) or, alternatively, as a plurality of interconnected patches of conductive material distributed over the surface of the photodetector (e.g. a comb-shaped configuration or any other configuration where the ratio perimeter length over surface area is increased).

Other aspects, features and advantages of the invention will be apparent upon reading the following detailed description of non-limiting examples and embodiments made with reference to the accompanying drawings.

DETAILED DESCRIPTION OF THE INVENTION

Figure 1:
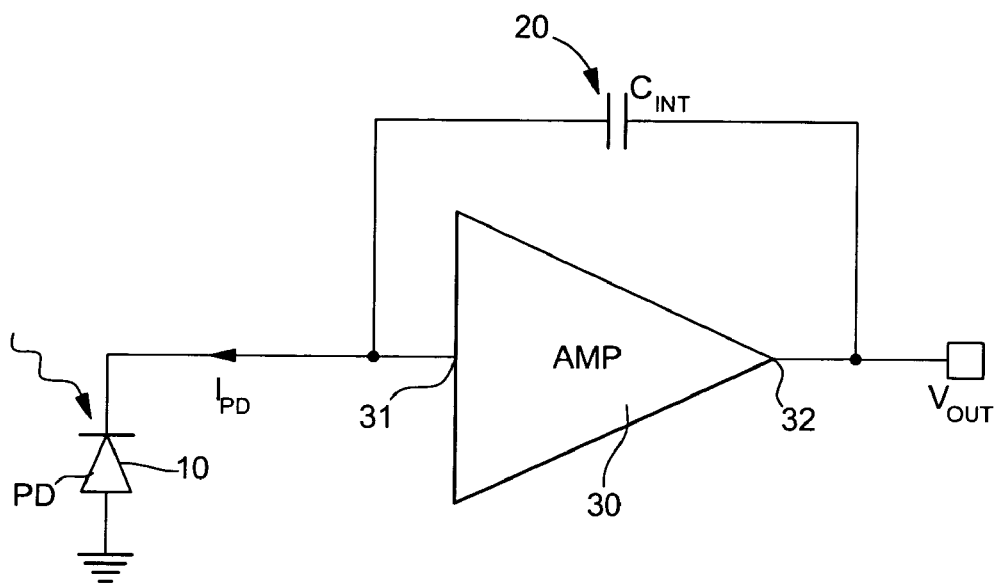
FIG. 1, which has already been discussed above, schematically shows a known integrating circuit configuration for converting light energy produced by a photodetector into a voltage signal.
Figure 2:
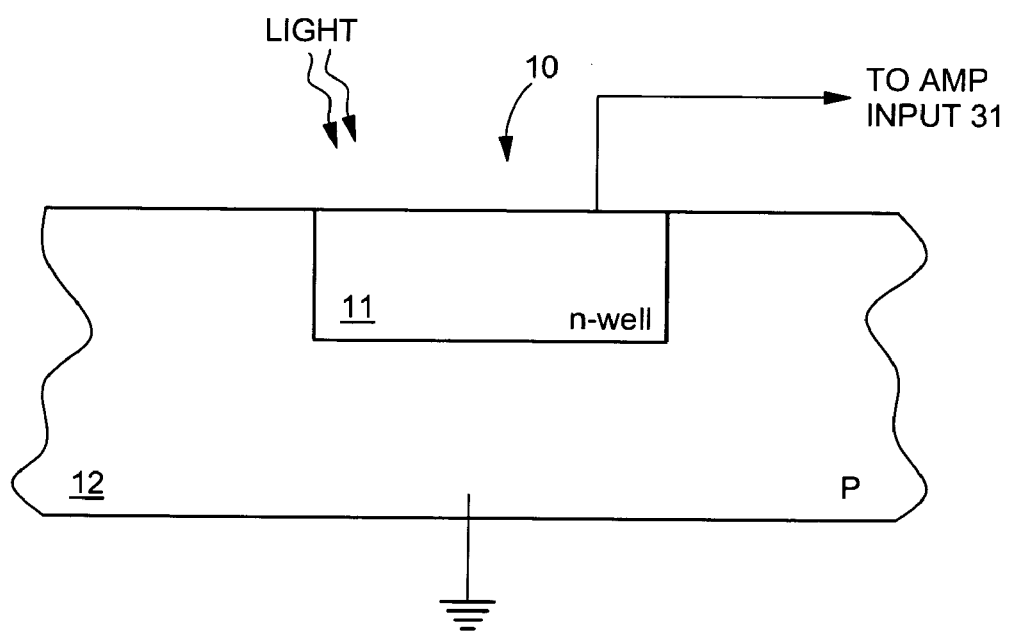
FIG. 2 schematically shows a known configuration of a photodiode which can be used as a photodetector in the circuit of FIG. 1.
Figure 3:
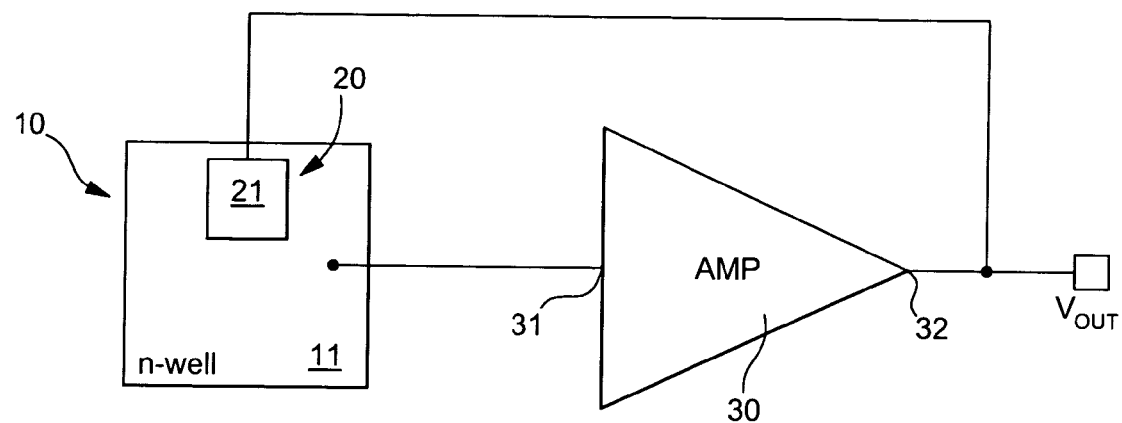
FIG. 3 is a schematic illustration of a photo-conversion integrating circuit according to one embodiment of the invention.
Figure 4:
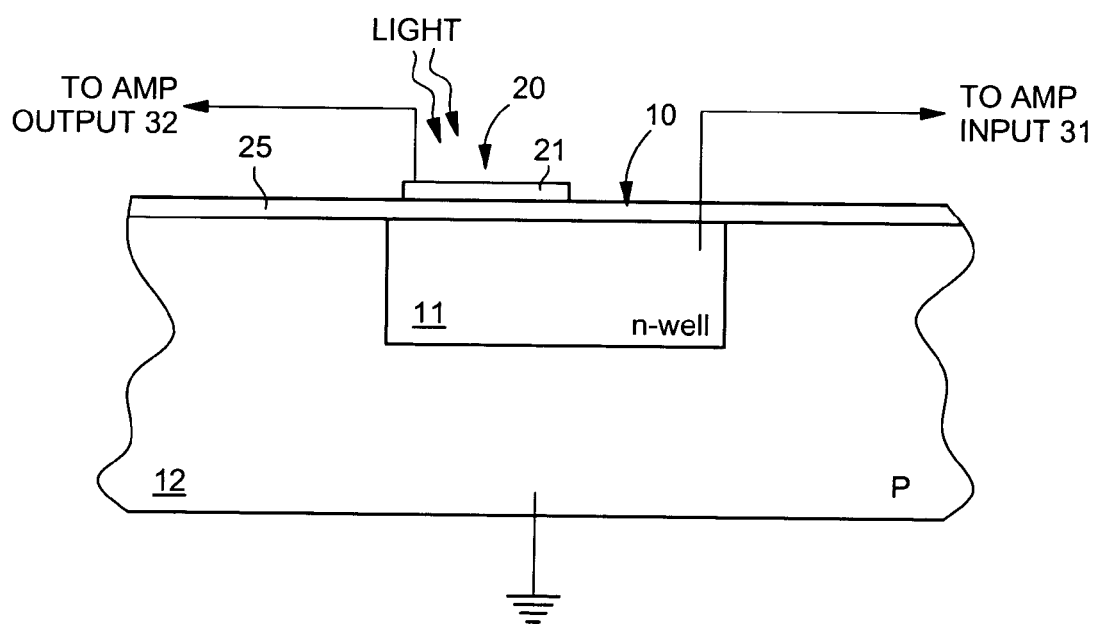
FIG. 4 is a schematic illustration of a cross-section of the photodetector and integration capacitor of FIG. 3.

FIG. 3 is a schematic illustration of an integrating circuit according to one embodiment of the invention. Photodetector 10 in FIG. 3 is depicted as an n-well photodiode comprising an n-well diffused in a p-type semiconductor substrate (or well). FIG. 4 is a schematic cross-section of the photodetector.

As shown in FIG. 3, the photosensitive region of the photodetector which outputs the photo-current, namely n-well 11, is coupled to an input 31 of amplifier 30. In contrast to the typical configuration, integration capacitor 20 is an integral part of photodetector 10. More particularly, the photosensitive region 11 of photodetector 10 acts as one electrode of integration capacitor 20 which, due to the already existing connection between photodetector 10 and amplifier 30, is connected to the amplifier's input 31. The second electrode of integration capacitor 20 is formed of a layer 21 of conductive material which is located on top of a portion of the photosensitive region 11 and connected to the amplifier's output 32. According to this embodiment, the second electrode is formed as a single and continuous patch of material having a substantially square shape in this example.

As illustrated in FIG. 4, conductive layer 21 is separated from the surface of the photodetector by a layer of insulating material designated globally by reference numeral 25 and which can be formed of an oxide layer (such as a layer of silicon dioxide $SiO_2$ in case the substrate is made of silicon material) or any other suitable insulating layer. In this example, insulating layer 25 covers the whole surface of the substrate but could alternatively be limited only to the portion of the surface where the conductive layer 21 of integration capacitor 20 is to be deposited.

One will of course understand that the combination of conductive layer 21, insulating layer 25 and well 11 forms a capacitor which is used in this case as the integration capacitor 20 of integrating circuit.

The invention has several advantages as compared to the typically known configuration. In particular, since integration capacitor 20 is formed on top of the photodetector 10, additional surface area on the chip for implementation of the capacitor is not anymore required. In addition, connections between the integration capacitor 20 and amplifier 30 is simplified since one electrode of the capacitor is already connected to the amplifier's input due to the interconnection between photodetector 10 and amplifier 30. This all leads to a better optimisation of the layout space.

As regards the properties of the materials used for realising integration capacitor, it is to be mentioned that layers 21 and 25 should be selected to be transparent or nearly transparent at least for a given range of wavelengths of light. Oxides are usually sufficiently transparent and may simply be used for forming insulating layer 25 without to much concern for its transparency property. It should furthermore be stressed that the layers overlying the photosensitive region of the photodetector need only exhibit substantially transparent properties for a selected range of wavelengths. For instance, many applications make use of photodetectors operating in the infrared domain and layers 21 and 25 need therefore only be transparent at those wavelengths.

Various types of materials might be used to fulfil the function of conductive layer 21. Metal layers might for instance be used since they are somewhat transparent at small thicknesses. Thin-film resistive layers which are available in some processes might also be used to form this layer. It is however preferable and advantageous to use a layer of non-salicided polysilicon to form conductive layer 21.

Due to changes in the indexes of refraction of the various layers overlying the photodetector, one should also consider multiple reflections and refractions in layers 21, 25, which could lead to constructive or destructive interferences, when designing the appropriate structure for the desired application. The optical properties of the full stack of layers overlying the photodetector's area should accordingly be optimised with consideration of the selected operating wavelength or wavelength range and by selecting the appropriate materials and thicknesses of layers 21, 25.

As regards the geometry of conductive layer 21, various designs might be envisaged. In general, it should be mentioned that the size of conductive layer 21 determines the size of integration capacitor 20. The size of integration capacitor, in particular the surface area coverage of layer 21, is to be determined with consideration to several process and circuit parameters which include, amongst other parameters, sensitivity, noise, process used for forming the various components of the circuit and integration time. As regards sensitivity and noise, the smaller the integration capacitor, the higher the sensitivity (which sensitivity is proportional to 1/C) and the higher the noise (which noise is essentially the square root of KT/C, where K is Boltzmann's constant and T the temperature). In general, the amount of surface area coverage of conductive layer 21 therefore depends on the process (capacitance per area) and the signal characteristics of the circuit (noise, sensitivity, integration time, etc.).

Figure 5:
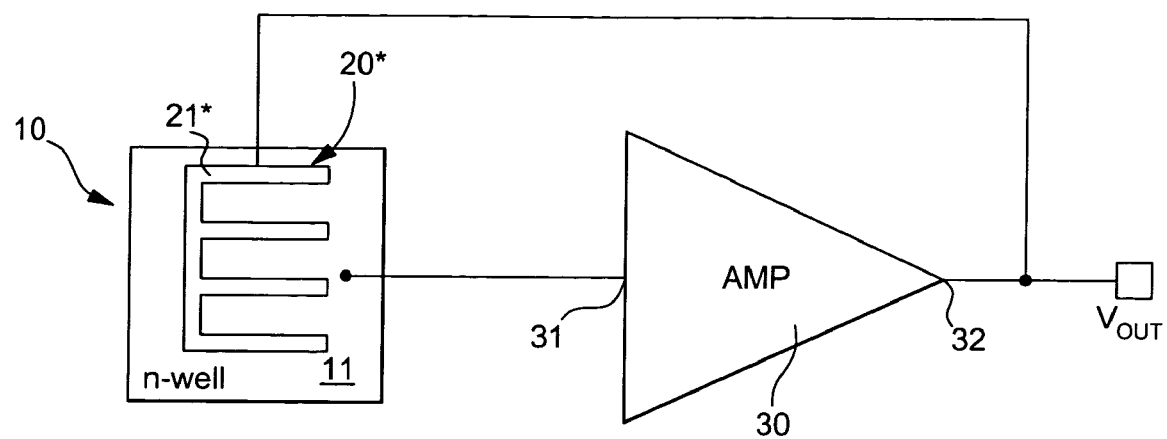
FIG. 5 is a schematic illustration of a photo-conversion integrating circuit according to an alterative embodiment of the invention.

As illustrated in FIG. 3, conductive layer 21 might simply be realised as a square-shaped patch of conductive material or, in general, as a single and continuous patch of material. Alternatively, conductive layer 21 might be formed as a plurality of interconnected patches of conductive material distributed over the surface of the photodetector. A possible example of such an embodiment is given in FIG. 5 where conductive layer, indicated in this example by reference numeral 21*, takes a comb-shaped configuration. A "distributed configuration" as shown in FIG. 5 might be preferable to more evenly distribute the conductive material over the photosensitive region 11 of the photodetector and prevent too strong light absorption in a localised area of the photodetector.

In addition, conductive layer 21 might be structured so as to additionally act as a sort of optical filter or absorber to filter selected wavelengths of light before hitting the surface of the photodetector.

Having described the invention with regard to certain specific embodiments, it is to be understood that these embodiments are not meant as limitations of the invention. Indeed, various modifications and/or adaptations may become apparent to those skilled in the art without departing from the scope of the annexed claims. For instance, the proposed embodiments are not necessarily limited to configurations where the conductive layer forming the second electrode of integration capacitor is square-shaped or comb-shaped as shown in the Figures. Any other geometry suitable for the desired application is possible.

In addition, the invention shall not be regarded as being limited to the use of photodiodes as photodetectors. Other types of photodetectors such as phototransistors might be used.

What is claimed is:

1. An integrating circuit for converting light energy produced by a photodetector into a voltage signal, this integrating circuit comprising:
    an amplifier having an input coupled to a terminal of the photodetector and an output for outputting the voltage signal; and
    an integration capacitor having a first electrode connected to the amplifier input and a second electrode connected to the amplifier output,
    wherein said first electrode of the capacitor is formed by the terminal of the photodetector connected to the amplifier input and wherein said second electrode is formed by a layer of conductive material deposited on top of the photodetector and separated from this photodetector by a layer of insulating material, said layers of conductive material and of insulating material being transparent or nearly transparent at least for a given range of wavelengths of light.

2. The integrating circuit of claim 1, wherein said layer of conductive material is a non-salicided polysilicon layer.

3. The integrating circuit of claim 1, wherein said photodetector is a photodiode comprising a well of a first conductivity type diffused in a semiconductor substrate or well of a second conductivity type.

4. The integrating circuit of claim 3, wherein said photodiode is formed of an n-type well diffused in a p-type semiconductor substrate or well.

5. The integrating circuit of claim 1, wherein said second electrode of the integration capacitor is formed as a single and continuous patch of conductive material.

6. The integrating circuit of claim 1, wherein said second electrode of the integration capacitor is formed as a plurality of interconnected patches of conductive material distributed over the surface of the photodetector.

7. The integrating circuit of claim 1, wherein said second electrode of the integration capacitor is further designed to form an optical filter for absorbing selected wavelengths of light.

8. A photodetector for connection to a conversion circuit including an integration capacitor for converting a photocurrent produced by said photodetector into a voltage signal,
    wherein said photodetector includes a layer of conductive material deposited on top of a photosensitive region of the photodetector and separated from this photosensitive region by a layer of insulating material,
    wherein said layer of conductive material acts as a first electrode of said integration capacitor while the photosensitive region of said photodetector acts as a second electrode of said integration capacitor, and
    wherein said layers of conductive material and of insulating material are transparent or nearly transparent at least for a given range of wavelengths of light.

9. The photodetector of claim 8, including a well of a first conductivity type forming said photosensitive region diffused in a semiconductor substrate or well of a second conductivity type.

10. The photodetector of claim 8, wherein said layer of conductive material is a non-salicided polysilicon layer.

11. The photodetector of claim 8, wherein said second electrode of the integration capacitor is formed as a single and continuous patch of conductive material.

12. The photodetector of claim 8, wherein said second electrode of the integration capacitor is formed as a plurality of interconnected patches of conductive material distributed over the surface of the photodetector.

13. The integrating circuit of claim 8, wherein said second electrode of the integration capacitor is further designed to form an optical filter for absorbing selected wavelengths of light.

* * * * *